United States Patent
Chang et al.

(10) Patent No.: US 7,286,012 B2
(45) Date of Patent: Oct. 23, 2007

(54) OPERATIONAL AMPLIFIER CIRCUIT WITH CONTROLLABLE INTERMEDIATE CIRCUITRY SET THEREIN

(75) Inventors: Yu-Jui Chang, Tainan County (TW); Ying-Lieh Chen, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 206 days.

(21) Appl. No.: 11/160,041

(22) Filed: Jun. 7, 2005

(65) Prior Publication Data

US 2006/0273850 A1   Dec. 7, 2006

(51) Int. Cl.
*H03G 3/20* (2006.01)
(52) U.S. Cl. ...................................... 330/144
(58) Field of Classification Search ................ 330/144, 330/284
See application file for complete search history.

(56) References Cited

U.S. PATENT DOCUMENTS

| | | | | |
|---|---|---|---|---|
| 5,455,538 A | * | 10/1995 | Kobayashi et al. | 330/149 |
| 5,564,086 A | * | 10/1996 | Cygan et al. | 455/126 |
| 6,710,617 B2 | | 3/2004 | Humphrey | 326/30 |

* cited by examiner

*Primary Examiner*—Steven J. Mottola
(74) *Attorney, Agent, or Firm*—Winston Hsu

(57) ABSTRACT

An operational amplifier circuit includes an operational amplifier, an intermediate circuitry, and a control circuitry. The intermediate circuitry is coupled to a load. The operational amplifier is coupled to the intermediate circuitry and drives the load through the intermediate circuitry according to an input signal. The control circuitry is coupled to the intermediate circuitry and controls the intermediate circuitry to adjust an equivalent loading induced by the intermediate circuitry.

8 Claims, 4 Drawing Sheets

OPERATIONAL AMPLIFIER CIRCUIT WITH CONTROLLABLE INTERMEDIATE CIRCUITRY SET THEREIN

BACKGROUND OF INVENTION

1. Field of the Invention

The present invention relates to an operational amplifier (op amp) circuit, and more particularly, to an operational amplifier circuit with a controllable intermediate circuitry set therein.

2. Description of the Prior Art

The operational amplifier (op amp) is an essential circuit building block of universal importance. A reason for the popularity of the op amp is its versatility; a great amount of operations can be done with op amps. Normally, an operational amplifier circuit is used to drive a load according to an analog input signal. However, if a digital input signal is adopted, a digital-to-analog converter (DAC) must be set in the signal input end of the operational amplifier circuit to convert the digital input signal into an analog input signal. The operational amplifier circuit can then drive the load according to the analog input signal. For instance, the liquid crystal display (LCD) source driver is a kind of device that needs to utilize an operational amplifier circuit including a DAC to drive a LCD display unit according to a digital input signal.

FIG. 1 shows a schematic diagram of a conventional operational amplifier circuit 100 utilized in a LCD source driver. The operational amplifier circuit 100 shown in FIG. 1 includes a DAC 110 and an op amp 120. The LCD display unit driven by the operational amplifier circuit 100 is represented by a block "load 190" in FIG. 1. The DAC 110 converts a digital input signal $S_{IN}$ of the LCD source driver into an analog input signal $S'_{IN}$. The op amp 120 then drives the load 190 according to the analog input signal $S'_{IN}$.

For the conventional operational amplifier circuit 100 shown in FIG. 1 to drive the load 190 moderately, the actual loading induced by the load 190 must be matched with the driving ability of the operational amplifier circuit 100. Herein the term "driving ability" can refer to charging current and discharging current providing ability of the operational amplifier circuit 100. The term "driving ability" can also refer to load charging and discharging speed of the operational amplifier circuit 100. When the actual loading induced by the load 190 is too small for the operational amplifier circuit 100 to drive, the load 190 might be over driven. An output voltage $V_{OUT}$ of the operational amplifier circuit 100 tends to become unstable and oscillating. When the actual loading induced by the load 190 is too large for the operational amplifier circuit 100 to drive, the load 190 might be under driven. It might become difficult for the operational amplifier circuit 100 to correctly adjust the level of the output voltage $V_{OUT}$ within a required time constraint.

SUMMARY OF INVENTION

It is an objective of the claimed invention to provide an operational amplifier circuit with a controllable intermediate circuitry set therein.

According to the claimed invention, an operational amplifier circuit is disclosed. The operational amplifier circuit comprises an intermediate circuitry coupled to a load, an operational amplifier coupled to the intermediate circuitry for driving the load through the intermediate circuitry, and a control circuitry coupled to the intermediate circuitry for controlling the intermediate circuitry to adjust an equivalent loading induced by the intermediate circuitry.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
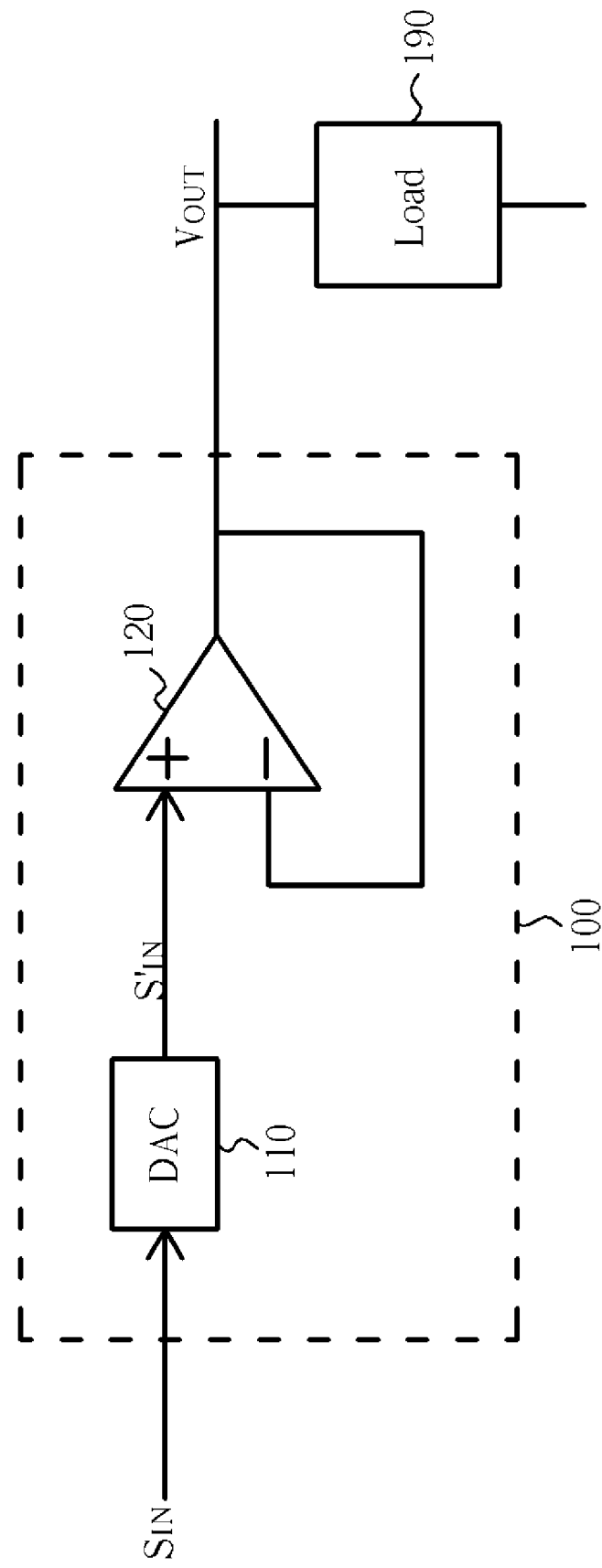
FIG. 1 shows a schematic diagram of a conventional operational amplifier circuit.
Figure 2:
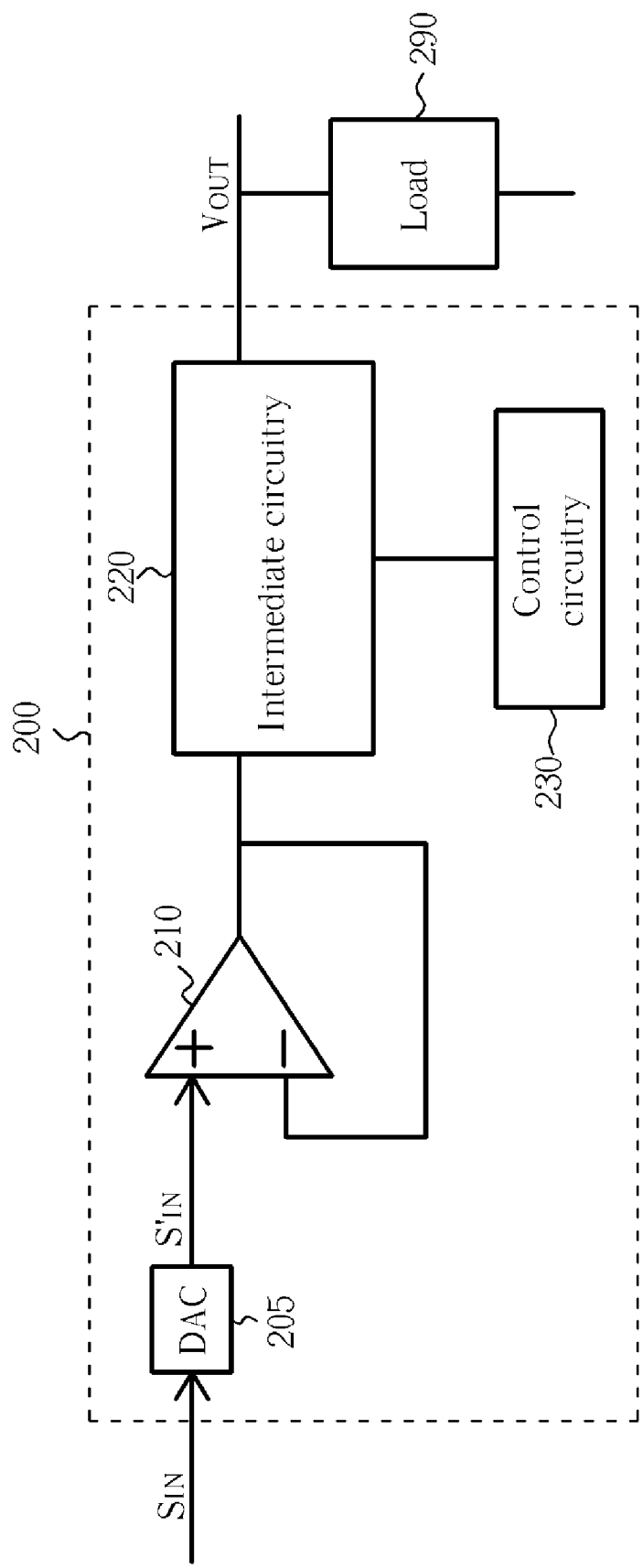
FIG. 2 shows a schematic diagram of an operational amplifier circuit according to an exemplary embodiment of the present invention.

FIG. 2 shows a schematic diagram of an operational amplifier circuit 200 according to an exemplary embodiment of the present invention. In this embodiment, the operational amplifier circuit 200 is set inside a LCD source driver for driving a LCD display unit according to a digital input signal $S_{IN}$. The LCD display unit is represent by a block "load 290" in FIG. 2. In other embodiments, however, the operational amplifier circuit of the present invention can also be set in other kind of device for driving a load according to a digital input signal or an analog input signal.

The operational amplifier circuit 200 shown in FIG. 2 includes a DAC 205, an op amp 210, an intermediate circuitry 220, and a control circuitry 230. The DAC 205 converts the digital input signal $S_{IN}$ of the LCD source driver into an analog input signal $S'_{IN}$ of the op amp 210. The op amp 210 then drives the load 290 through the intermediate circuitry 220 according to the analog input signal $S'_{IN}$.

In this embodiment, the control circuitry 230 is used to control the intermediate circuitry 220 to adjust an equivalent loading induced by the intermediate circuitry 220. How the equivalent loading induced by the intermediate circuitry 220 is controlled by the control circuitry 230 is determined according to an actual loading induced by the load 290. When the actual loading induced by the load 290 is too small for the op amp 210 to drive, the control circuitry 230 controls the intermediate circuitry 220 to increase the equivalent loading induced by the intermediate circuitry 220. The situation of over driving on the load 290 is therefore avoided. When the actual loading induced by the load 290 is suitable for the op amp 210 to drive, the control circuitry 230 controls the intermediate circuitry 220 to decrease the equivalent loading induced by the intermediate circuitry 220. The load 290 is then moderately driven by the op amp 210 through the intermediate circuitry 220. In other words, with the intermediate circuitry 220 and the control circuitry 230, the overall loading seen by the op amp 210 can be easily maintained in a range suitably for being driven by the op amp 210.

Figure 3:
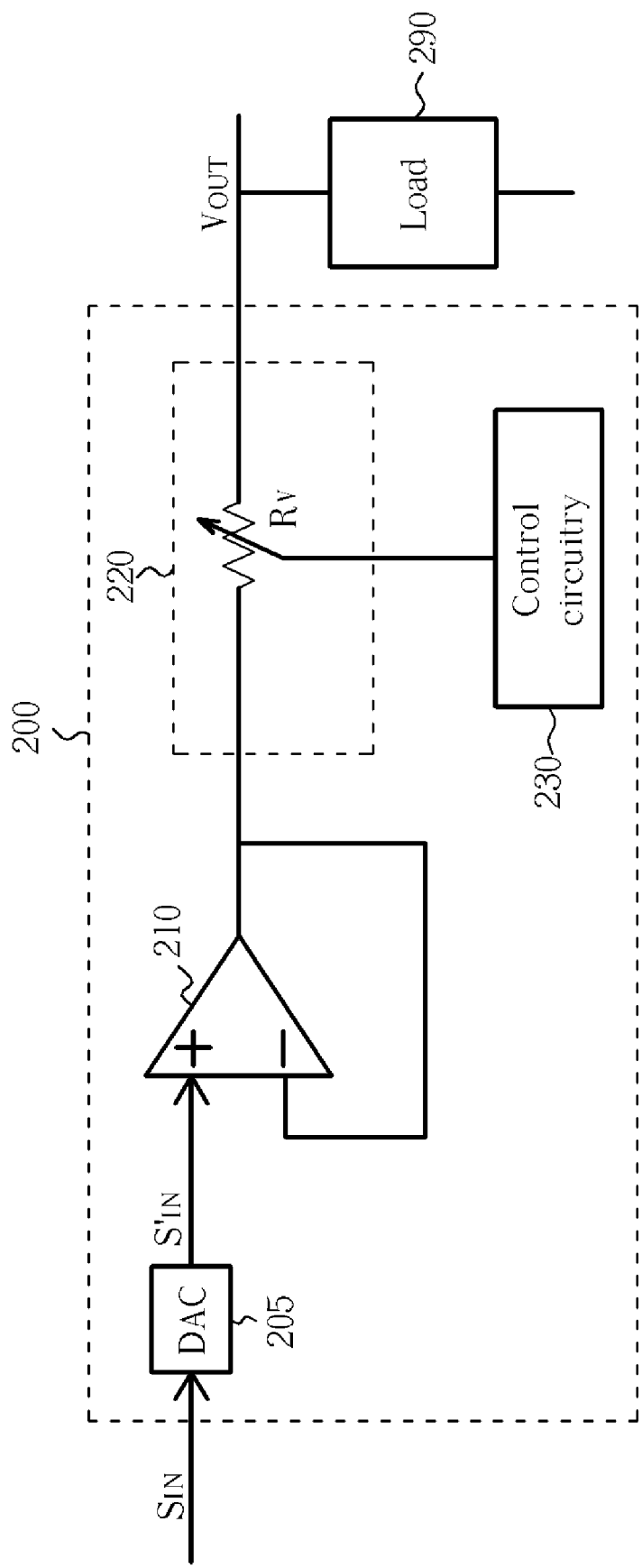
FIG. 3 shows a schematic diagram of an operational amplifier circuit including a variable resistor for realizing an intermediate circuitry of the operational amplifier circuit.

As is illustrated in FIG. 3, in one embodiment, a variable resistor $R_V$ controlled by the control circuitry 230 can be used to realize the intermediate circuitry 220. The control circuitry 230 controls the equivalent loading induced by the variable resistor $R_V$ through adjusting a resistance of the variable resistor $R_V$. In other embodiments, the intermediate circuitry 220 can also be realized by a plurality of parallel-connected transistors, each of the transistors has a control terminal coupled to the control circuitry 230, a first terminal coupled to the op amp 210, and a second terminal coupled to the load 290. The control circuitry 230 controls voltage levels at the control terminals of the transistors to adjust the equivalent loading induced by the intermediate circuitry 220. Except for only two transistors are shown, the schematic diagram shown in FIG. 4 shows an example illustrates how transistors are utilized to realize the intermediate circuitry 220.

Figure 4:
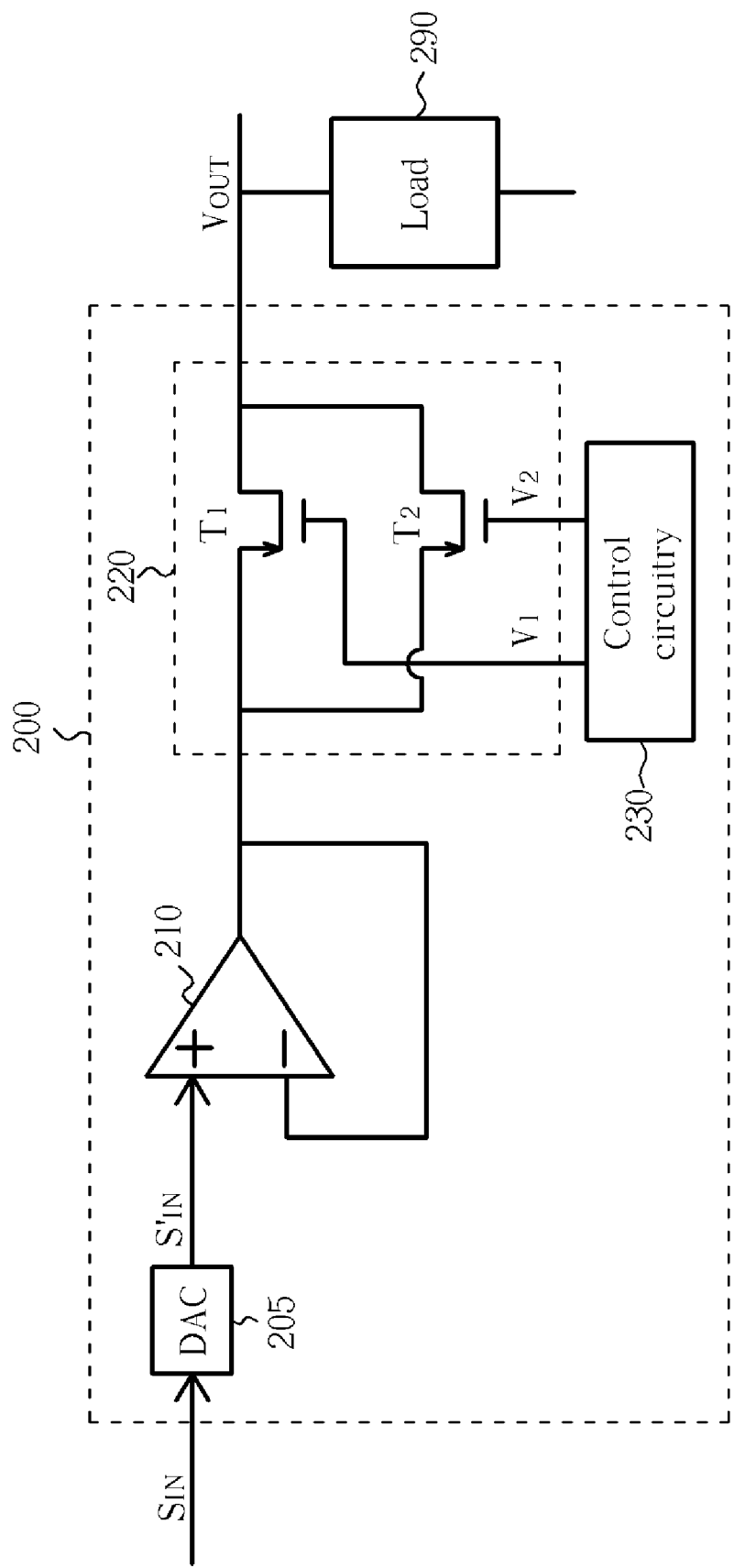
FIG. 4 shows a schematic diagram of an operational amplifier circuit including a plurality of transistors for realizing an intermediate circuitry of the operational amplifier circuit.

For the embodiment shown in FIG. 4, there are two transistors $T_1$ and $T_2$ utilized to realize the intermediate circuitry 220. The size of a first transistor $T_1$ is larger than the size of the second transistor $T_2$. When the actual loading induced by the load 290 is suitable for the op amp 210 to drive, the control circuitry 230 turns both the transistors $T_1$ and $T_2$ on to let the intermediate circuitry 220 to provide a smaller equivalent loading. When the actual loading induced by the load 290 is too small for the op amp 210 to drive, the control circuitry 230 turns the second transistor $T_2$ on while turning the first transistor $T_1$ off to let the intermediate circuitry 220 to provide a larger equivalent loading. Since the equivalent loading induced by the intermediate circuitry 220 can be controlled by the control circuitry 230, the overall loading seen by the op amp 210 can be easily adjusted to a range suitably for being driven by the op amp 210. The overall loading seen by the op amp 210 can be driven more moderately, and an output voltage $V_{OUT}$ of the operational amplifier circuit 200 is therefore more stably controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier circuit, comprising:
    an intermediate circuitry coupled to a load;
    an operational amplifier coupled to the intermediate circuitry for driving the load through the intermediate circuitry according to an input signal; and
    a control circuitry coupled to the intermediate circuitry for controlling the intermediate circuitry to adjust an equivalent loading induced by the intermediate circuitry, wherein the control circuitry controls the intermediate circuitry to adjust the equivalent loading induced by the intermediate circuitry according to an actual loading induced by the load.

2. The operational amplifier circuit of claim 1, wherein the intermediate circuitry comprises a variable resistor controlled by the control circuitry.

3. The operational amplifier circuit of claim 1, wherein the intermediate circuitry comprises a plurality of transistors, each one of the transistors has a control terminal coupled to the control circuitry, a first terminal coupled to the operational amplifier, and a second terminal coupled to the load; and the control circuitry controls voltage levels at the control terminals of the transistors to adjust the equivalent loading induced by of the intermediate circuitry.

4. The operational amplifier circuit of claim 1, wherein the input signal is a digital input signal, the operational amplifier circuit further comprises a digital to analog converter (DAC) coupled to the operational amplifier for converting the digital input signal into an analog input signal, and the operational amplifier drives the load through the intermediate circuitry according to the analog input signal received from the DAC.

5. The operational amplifier circuit of claim 1, wherein the operational amplifier circuit is set inside a liquid crystal display (LCD) source driver for driving the load according to the input signal, and the load is a LCD display unit.

6. A display driving circuit comprising:
    an intermediate circuitry coupled to a display unit;
    a digital to analog converter (DAC), for converting a digital input signal into an analog input signal;
    an operational amplifier, coupled to the DAC and the intermediate circuitry, for driving the display unit through the intermediate circuitry according to the analog input signal received from the DAC; and
    a control circuitry coupled to the intermediate circuitry for controlling the intermediate circuitry to adjust an equivalent loading induced by the intermediate circuitry.

7. The display driving circuit of claim 6, wherein the intermediate circuitry comprises a variable resistor controlled by the control circuitry.

8. The display driving circuit of claim 6, wherein the intermediate circuitry comprises a plurality of transistors, each one of the transistors has a control terminal coupled to the control circuitry, a first terminal coupled to the operational amplifier, and a second terminal coupled to the load; and the control circuitry controls voltage levels at the control terminals of the transistors to adjust the equivalent loading induced by of the intermediate circuitry.

* * * * *